United States Patent
Costa et al.

(10) Patent No.: US 7,135,929 B1
(45) Date of Patent: Nov. 14, 2006

(54) BIAS VOLTAGE CIRCUIT WITH ULTRA LOW OUTPUT IMPEDANCE

(75) Inventors: Damian Costa, San Diego, CA (US); Shahram Mahdavi, San Diego, CA (US); John Groe, Poway, CA (US)

(73) Assignee: Sequoia Communications, San Diego, CA (US)

( * ) Notice: Subject to any disclaimer, the term of this patent is extended or adjusted under 35 U.S.C. 154(b) by 0 days.

(21) Appl. No.: 10/828,826

(22) Filed: Apr. 21, 2004

Related U.S. Application Data

(60) Provisional application No. 60/464,427, filed on Apr. 22, 2003.

(51) Int. Cl.
*H03F 3/04* (2006.01)
(52) U.S. Cl. .................... 330/296; 330/297
(58) Field of Classification Search ............... 330/311, 330/264, 265, 269, 278, 282, 287, 300, 98, 330/99, 100, 294, 295, 285, 288, 289, 296, 330/290
See application file for complete search history.

(56) References Cited

U.S. PATENT DOCUMENTS

| | | | | |
|---|---|---|---|---|
| 4,730,278 A * | 3/1988 | Koury et al. | ............... | 365/203 |
| 5,343,092 A * | 8/1994 | Dhong et al. | ............... | 326/126 |
| 6,114,913 A * | 9/2000 | Entrikin | ..................... | 330/308 |
| 6,333,677 B1 * | 12/2001 | Dening | ........................ | 330/296 |
| 6,496,074 B1 * | 12/2002 | Sowlati | ....................... | 330/311 |
| 6,724,270 B1 * | 4/2004 | Kozu | ..................... | 331/117 R |
| 6,744,322 B1 * | 6/2004 | Ma et al. | .................... | 330/300 |
| 6,970,039 B1 * | 11/2005 | Griffith et al. | .......... | 330/124 R |
| 2003/0151461 A1 * | 8/2003 | Arayashiki et al. | ......... | 330/278 |

* cited by examiner

*Primary Examiner*—Linh Nguyen
(74) *Attorney, Agent, or Firm*—Cooley Godward Kronish LLP; Daniel Tagliaferri, Esq.

(57) ABSTRACT

A bias voltage circuit with ultra low output impedance. The circuit incorporates feedback to reduce the output impedance at both low and RF frequencies. The bias circuit outputs a bias signal for biasing an amplifier. The bias circuit includes an input stage that receives an input signal and produces the bias signal at an output terminal that is coupled to a gain stage. The bias circuit also includes a load coupled to the input stage at a first terminal, and a feedback circuit coupled between the first terminal and the gain stage.

2 Claims, 2 Drawing Sheets

BIAS VOLTAGE CIRCUIT WITH ULTRA LOW OUTPUT IMPEDANCE

CROSS REFERENCE TO RELATED APPLICATIONS

The present Application claims the benefit of priority from a co-pending U.S. Provisional Patent Application entitled, "BIAS VOLTAGE CIRCUIT WITH ULTRA LOW OUTPUT IMPEDANCE" having Application No. 60/464,427 and filed on Apr. 22, 2003, the disclosure of which is incorporated by reference herein in its entirety for all purposes.

FIELD

The present invention relates generally to bias circuits, and more particularly, to a bias circuit with ultra low output impedance that is suitable for use with low noise amplifiers (LNA) to enhance linearity.

BACKGROUD

The presence of low-frequency distortion products significantly affects the linearity of an amplifier at radio frequencies (RF). The input-referred third-order intercept point (IIP$_3$) can be improved by insuring that the output impedance of a dc bias circuit is low at a difference frequency ($f_2-f_1$) between two test frequency tones ($f_1$ and $f_2$) used to measure the linearity. This low-frequency impedance technique has been used to optimize the distortion performance of power amplifiers and common-emitter LNAs.

FIG. 1 shows a simplified schematic diagram of a typical cascode LNA consisting of a common-emitter input stage ($Q_1$) and a cascode output stage ($Q_2$). Transistor $Q_1$ is biased through the combination of a resistor ($R_{bias1}$) and a shunt low-frequency trap network consisting of the inductor $L_t$ in series with the capacitor $C_t$. The resistor $R_{bias1}$ is made large enough to isolate the bias circuit (which generates $V_{bias1}$) from the RF signal at the base of $Q_1$, while the low-frequency trap shorts out the difference frequency, and thus enhances the IIP$_3$. Inductor $L_t$ and capacitor $C_t$ are typically realized with external components because of their large values.

Cascode transistor $Q_2$ operates as a common-base amplifier with capacitor $C_2$ providing an ac-ground at RF frequencies. A bias circuit (Cascode Bias Ckt) generates the required dc bias voltage ($V_{bias2}$). The low-frequency impedance seen at the base of $Q_2$ also strongly impacts the linearity of the LNA. Ideally, the base of $Q_2$ would see an impedance to ground having a value at or near zero for all frequencies.

FIGS. 2a and 2b show two typical bias circuits for generating $V_{bias2}$. In FIG. 2a, the bias voltage is generated by using an emitter follower to buffer and dc level-shift the reference voltage ($V_{ref}$). In FIG. 2b, the bias voltage is generated by forcing a current through two diode-connected transistors ($D_1$ and $D_2$) and a resistor ($R_{bias2}$). At low frequencies, the output resistances of these two circuits is approximately;

$$R_{o2a} \approx r'_{e3} + \frac{R_s}{\beta_3 + 1} \quad (1)$$

and $$R_{o2b} \approx 2r'_d + R_{bias2} \quad (2)$$

where $R_S$ is the equivalent resistance of the source driving the emitter follower, $\beta_3$ is the current gain of $Q_3$, n is the ideality factor, and $V_T$ is the thermal voltage. The first terms in these equations represents the incremental resistance of the active devices and is defined as;

$$r'_{e3} = r'_d = \frac{\partial V_{be}}{\partial I_c} = \frac{nV_T}{I_o} \quad (3)$$

which strongly depends on the bias current. In practice, this resistance dominates the overall output resistance. This unfortunately means a large dc bias current $I_0$ is required to produce a low output resistance. Accordingly, a need remains for a low-current circuit that approaches an ideal voltage source at both low and RF frequencies.

SUMMARY

In one or more embodiments, a bias circuit is provided whose output impedance is made ultra low over a wide frequency range at low current. In one embodiment, the bias circuit is used to dc bias a cascode transistor of a cascode LNA, such as the LNA shown in FIG. 1. By reducing the low-frequency impedance seen at the base of the cascode transistor, the linearity of the LNA is dramatically increased.

In one or more embodiments, the bias circuit comprises an emitter follower transistor having a collector connected to a load. A shunt feedback network is coupled from the collector of the emitter follower transistor to the base of a common-emitter transistor. The feedback network senses the voltage at the collector of the emitter follower transistor and returns a portion of the sensed voltage to the base of the common-emitter transistor. The collector of the common-emitter transistor is coupled to the emitter-follower's emitter terminal, which is also the output of the bias circuit. The voltage at the base of the common-emitter transistor produces a collector current and thus completes the feedback loop.

As compared to the circuits of FIGS. 2a and 2b, the feedback of the bias circuit operates to reduce its output impedance by a factor of the loop gain while providing the same dc bias current. Since, in one embodiment, the bias circuit only stacks two transistors, it can operate with low supply voltages. In addition, the small number of circuit elements makes embodiments of the bias circuit simple, compact, and capable of operating over a wide frequency range.

In one embodiment, a bias circuit is provided that outputs a bias signal for biasing an amplifier. The bias circuit comprises an input stage that receives an input signal and produces the bias signal at an output terminal that is coupled to a gain stage. The bias circuit also comprises a load coupled to the input stage at a first terminal, and a feedback circuit coupled between the first terminal and the gain stage.

BRIEF DESCRIPTION OF THE DRAWINGS

The foregoing and other objects, features, and advantages of the described embodiments will become more apparent with reference to the following detailed description and accompanying drawings wherein.

DETAILED DESCRIPTION

In one or more embodiments, a bias circuit is provided whose output impedance is made ultra low over a wide frequency range at low current. The bias circuit is suitable for use with LNAs where its reduced low-frequency impedance can dramatically increase the linearity of the LNA.

Figure 1:
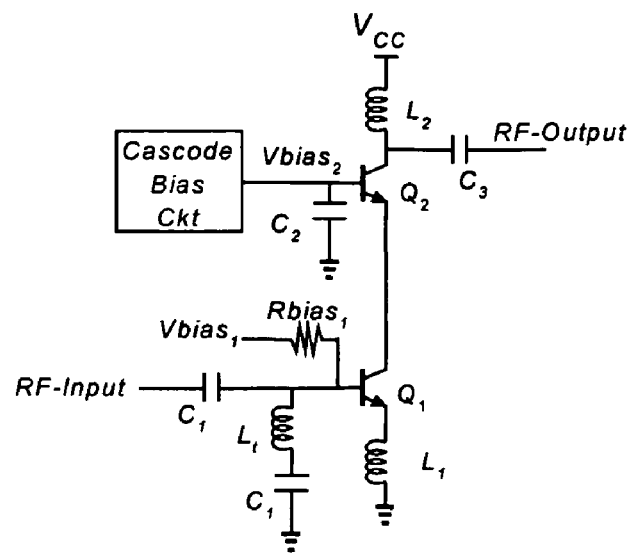
FIG. 1 shows a typical cascode LNA.
Figure 2A:
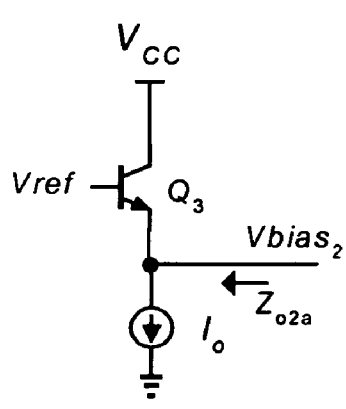
FIGS. 2a–b show typical bias circuits.
Figure 2B:
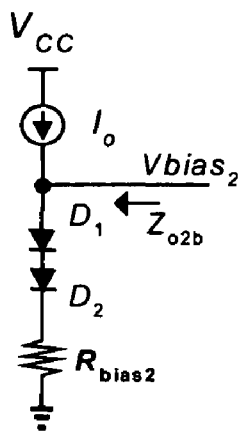
Figure 3:
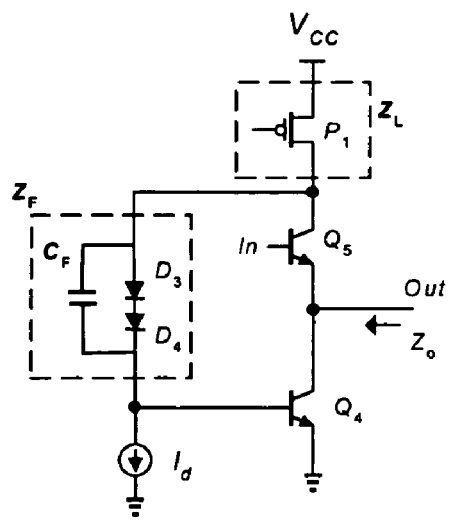
FIG. 3 shows one embodiment of a bias circuit with feedback that has an ultra low output impedance.

FIG. 3 shows one embodiment of a bias circuit with ultra low output impedance. The bias circuit comprises an input emitter-follower stage formed by transistor $Q_5$, a load element ($Z_L$), a feedback network ($Z_F$), and a common-emitter gain stage that comprises transistor $Q_4$. During operation, the load $Z_L$ generates a voltage at the collector of transistor $Q_5$, which can be expressed as:

$$V_{C5} \approx V_{CC} - I_5(Z_L \| Z_F + Z_{IN4}) \approx g_{m5}V_o \frac{Z_L(Z_F + Z_{IN4})}{Z_L + Z_F + Z_{IN4}} \quad (4)$$

where $I_5$ is the emitter current of transistor $Q_5$, $g_{m5}$ is the transconductance of transistor $Q_5$, $V_0$ is output voltage, and $Z_{in4}$ is the input impedance of transistor $Q_4$. The feedback network senses $V_{c5}$ and forms a voltage divider with the input impedance of transistor $Q_4$. The resulting voltage at the base of $Q_4$ can be written as:

$$V_{b4} \approx (V_{CC} - V_{c5}) \frac{Z_{in4}}{Z_{in4} + Z_F} = V_{CC} \frac{Z_{in4}}{Z_{in4} + Z_F} - g_{m5}V_o \frac{Z_{in4}Z_L}{Z_{in4} + Z_F + Z_L} \quad (5)$$

It follows then that the collector current of $Q_4$ equals:

$$I_4 = g_{m4}V_{b4} \approx g_{m4}V_{CC} \frac{Z_{in4}}{Z_{in4} + Z_F} - g_{m4}g_{m5}V_o \frac{Z_{in4}Z_L}{Z_{in4} + Z_F + Z_L} \quad (6)$$

where $g_{m4}$ is the transconductance of $Q_4$. Note that the first term sets the dc operating point of the circuit, while the second term describes its dynamic operating point. The dynamic output current ($I_0$) is described by:

$$I_o = I_4 - I_5 = g_{m5}\left(g_{m4}\frac{Z_{in4}Z_L}{Z_{in4} + Z_F + Z_L} + 1\right)V_{o'} \quad (7)$$

And the output impedance is then:

$$Z_o = \frac{V_o}{I_o} = \frac{1}{g_{m5}\left(g_{m4}\frac{Z_{in4}Z_L}{Z_{in4} + Z_F + Z_L} + 1\right)} \approx \frac{r'_{e5}}{g_{m4}\frac{Z_{in4}Z_L}{Z_{in4} + Z_F + Z_L} + 1}. \quad (8)$$

which is significantly reduced compared to the conventional bias circuits. In fact, in one or more embodiments, the output impedance is reduced by a factor equal to:

$$g_{m4}\frac{Z_{in4}Z_L}{Z_{in4} + Z_F + Z_L} + 1$$

when operating at the same bias current as a conventional circuit.

In practice, the load impedance $Z_L$ is realized by a current source or a resistor. A current source—using PMOS or PNP transistors—realizes an active load with a high impedance ($Z_L$), which in turn increases the feedback factor and thereby lowers the output impedance ($Z_0$) of the circuit. In addition, the dc level-shifting network (formed by diodes, a $V_{be}$-multiplier or other known technique) includes a shunt capacitor $C_F$ to lower and the impedance $Z_F$.

Figure 4:
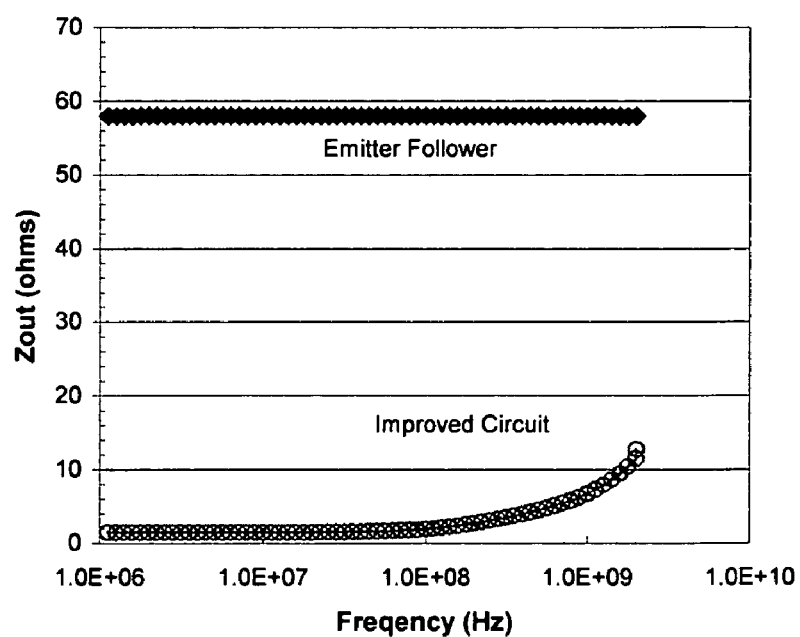
FIG. 4 shows a graph that illustrates the difference in performance of a cascode LNA when biased by the conventional bias circuit shown FIG. 2a and a novel bias circuit constructed in accordance with the described embodiments.

FIG. 4 shows a graph that illustrates the performance advantage of a cascode LNA biased by one embodiment of the described bias circuit as compared to a conventional circuit. The graph shows the output impedances of the conventional bias circuit compared to the ultra-low output impedance of one embodiment of the bias circuit at the same dc current of 500 µA. It's clear that the novel bias circuit dramatically lowers the impedance at both low and RF frequencies. This translates to improved linearity, approximately 3 dB for the cascode LNA, without lowering gain or degrading the noise figure.

These results demonstrate the linearity improvement provided by one embodiment of a low-impedance bias circuit when used with an LNA. Accordingly, while one or more embodiments of the bias circuit have been illustrated and described herein, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. A bias circuit that outputs a bias signal that varies linearly with an input signal, the bias circuit comprising:
    an input stage that receives the input signal and produces the bias signal at an output terminal that is coupled to a gain stage, wherein the gain stage comprises a common-emitter gain stage that has a base terminal;
    a load coupled to the input stage at a first terminal; and
    a feedback circuit coupled between the first terminal, the base terminal, and the gain stage, wherein the feedback circuit comprises:
    first and second diodes; and
    a capacitor coupled to the first and second diodes.

2. A bias circuit that outputs a bias signal that varies linearly with an input signal, the bias circuit comprising:
    an input stage that receives the input signal and produces the bias signal at an output terminal that is coupled to a gain stage;
    a load coupled to the input stage at a first terminal; and
    a feedback circuit coupled between the first terminal and the gain stage, wherein the feedback circuit comprises:
    first and second diodes; and
    a capacitor coupled to the first and second diodes.

* * * * *